(12) United States Patent
Miyazawa

(10) Patent No.: US 8,459,780 B2
(45) Date of Patent: Jun. 11, 2013

(54) PIEZOELECTRIC ELEMENT, LIQUID-EJECTING HEAD, AND LIQUID-EJECTING APPARATUS

(75) Inventor: Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 13/100,932

(22) Filed: May 4, 2011

(65) Prior Publication Data

US 2011/0273517 A1    Nov. 10, 2011

(30) Foreign Application Priority Data

May 7, 2010    (JP) .................................. 2010-107741

(51) Int. Cl.
*B41J 2/045*    (2006.01)
*H01L 41/18*    (2006.01)

(52) U.S. Cl.
USPC ............................................ 347/68; 310/311

(58) Field of Classification Search
USPC ............................................ 310/311; 347/68
See application file for complete search history.

(56) References Cited

U.S. PATENT DOCUMENTS

2009/0020797 A1*  1/2009  Wang .......................... 257/295

FOREIGN PATENT DOCUMENTS

| JP | 2001-223404 A | 8/2001 |
| JP | 2008078248 A * | 4/2008 |
| WO | WO 2010013438 A1 * | 2/2010 |

OTHER PUBLICATIONS

Wikipedia Article: Cerium, paragraph 1, p. 1; Wikipedia Article: Rare Earth Elements, List, p. 1.*

* cited by examiner

*Primary Examiner* — Matthew Luu
*Assistant Examiner* — Lisa M Solomon
(74) *Attorney, Agent, or Firm* — Workman Nydegger

(57) ABSTRACT

A piezoelectric element includes electrodes and a piezoelectric layer provided between the electrodes. The piezoelectric layer is made of a complex oxide which contains bismuth, iron, and chromium. The piezoelectric layer contains 0.125 to 0.875 mole of chromium per mole of the combination of iron and chromium.

7 Claims, 11 Drawing Sheets

BiFeO$_3$

Bi DEFECTS

BiCeFeO$_3$

BiFeCrO$_3$

PIEZOELECTRIC ELEMENT, LIQUID-EJECTING HEAD, AND LIQUID-EJECTING APPARATUS

CROSS-REFERENCE TO RELATED APPLICATIONS

This application claims the benefit of priority to Japanese Patent Application No. 2010-107741 filed May 7, 2010, the contents of which are hereby incorporated by reference in their entirety.

BACKGROUND

1. Technical Field

The present invention relates to a liquid-ejecting head including a piezoelectric element which changes the pressure in a pressure-generating chamber communicating with a nozzle opening and which includes a piezoelectric layer and electrodes for applying a voltage to the piezoelectric layer, a liquid-ejecting apparatus, and a piezoelectric element.

2. Related Art

Piezoelectric actuators for use in liquid-ejecting heads include piezoelectric elements each including two electrodes and a piezoelectric layer which is made of a piezoelectric material, such as a crystallized piezoelectric material, having an electromechanical transducing function and which is sandwiched between the electrodes. A typical example of the liquid-ejecting apparatuses is an ink jet recording head including a diagram forming a portion of a pressure-generating chamber communicating with a nozzle opening for ejecting ink droplets. The ink jet recording head ejects ink droplets in such a manner that the diagram is deformed with a piezoelectric element such that ink in the pressure-generating chamber is pressurized.

A piezoelectric material used to form a piezoelectric layer (piezoelectric ceramic) making up the piezoelectric element needs to have high piezoelectric properties. A typical example of the piezoelectric material is lead zirconate titanate (PZT) (see JP-A-2001-223404).

In awareness of environment issues, piezoelectric materials with a reduced lead content are being demanded. An example of lead-free piezoelectric materials is $BiFeO_3$, which has a perovskite structure represented by the formula $ABO_3$. Since $BiFeO_3$ piezoelectric materials have a strain less than that of lead zirconate titanate (PZT), piezoelectric materials having a large strain and excellent piezoelectric properties are being demanded.

Such an issue is present not only in the ink jet recording head but also in liquid-ejecting heads ejecting droplets other than ink droplets and piezoelectric elements for use in heads other than the liquid-ejecting heads.

SUMMARY

An advantage of some aspects of the invention is to provide a liquid-ejecting head which is environmentally friendly and which has excellent piezoelectric properties, a liquid-ejecting apparatus, and a piezoelectric element.

An embodiment of the invention is directed to a liquid-ejecting head that includes a pressure-generating chamber communicating with a nozzle opening and also includes a piezoelectric element including a piezoelectric layer and electrodes disposed on the piezoelectric layer. The piezoelectric layer is made of a complex oxide which contains bismuth, iron, and chromium and which has a perovskite structure and contains 0.125 to 0.875 mole of chromium per mole of the combination of iron and chromium.

This allows the liquid-ejecting head to have excellent piezoelectric properties. The liquid-ejecting head contains no lead and therefore is capable of reducing the impact on the environment.

In the liquid-ejecting head, bismuth is preferably contained in the A-site of the complex oxide and iron and chromium are preferably contained in the B-site thereof.

The complex oxide preferably further contains cerium. The complex oxide is preferably represented by the following formula:

$$(Bi_{1-x}Ce_{3x/4})(Cr_{1-\delta}Fe_\delta)O_3 \tag{1}.$$

This allows the complex oxide to have high insulation and allows leakage currents to be suppressed.

The piezoelectric layer preferably has a monoclinic crystal structure. This allows the piezoelectric layer to have excellent piezoelectric properties.

The complex oxide may further contain lanthanum.

Another embodiment of the inventor is directed to a liquid-ejecting apparatus including the liquid-ejecting head.

The liquid-ejecting apparatus has excellent piezoelectric properties. The liquid-ejecting apparatus contains no lead and therefore is capable of reducing the impact on the environment.

Another embodiment of the inventor is directed to a piezoelectric element including a piezoelectric layer and electrodes disposed on the piezoelectric layer. The piezoelectric layer is made of a complex oxide which contains bismuth, iron, and chromium and which has a perovskite structure and contains 0.125 to 0.875 mole of chromium per mole of the combination of iron and chromium.

The piezoelectric element has excellent piezoelectric properties. The piezoelectric element contains no lead and therefore is capable of reducing the impact on the environment.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
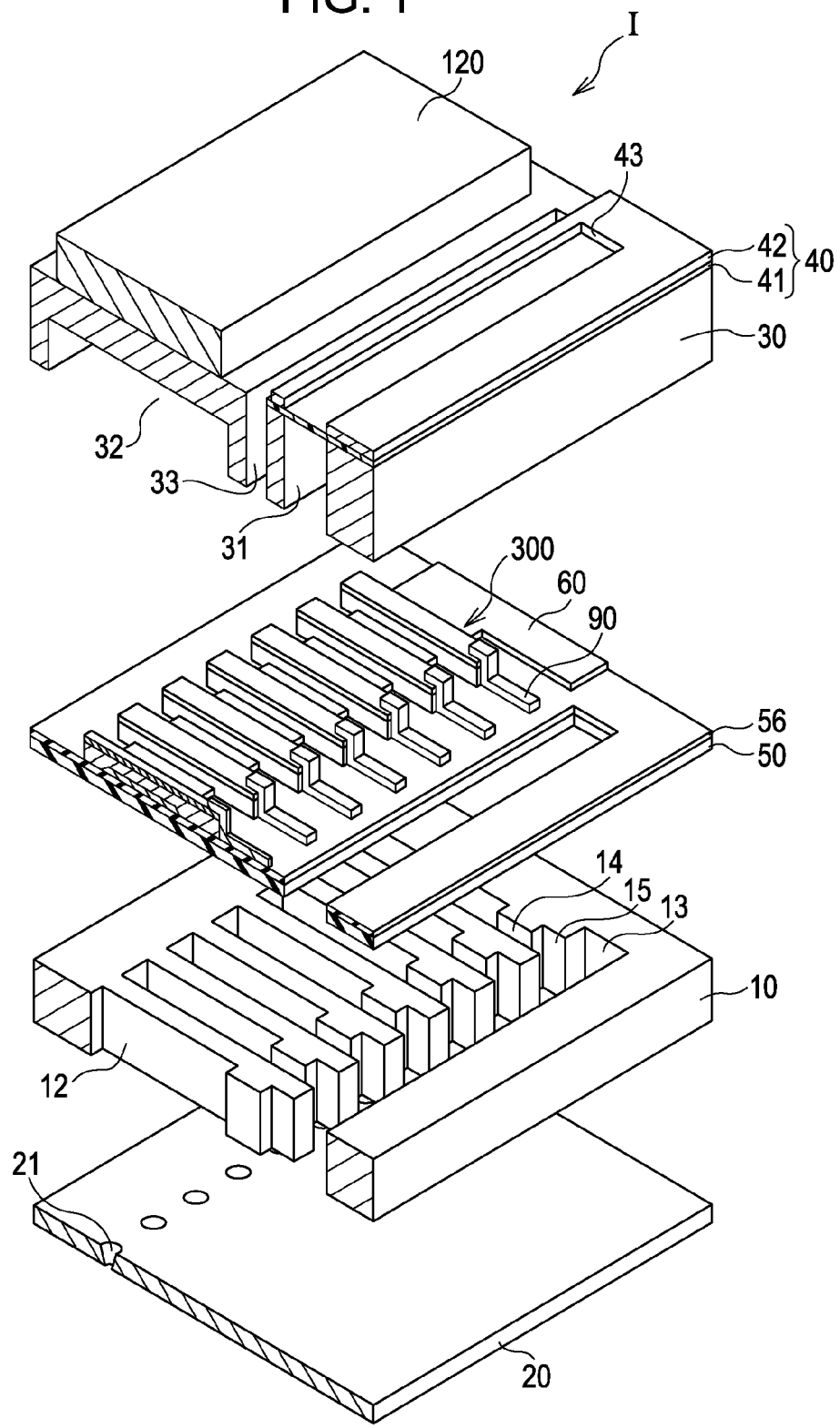
FIG. 1 is an exploded perspective view of an ink jet recording head according to a first embodiment of the invention.
Figure 2:
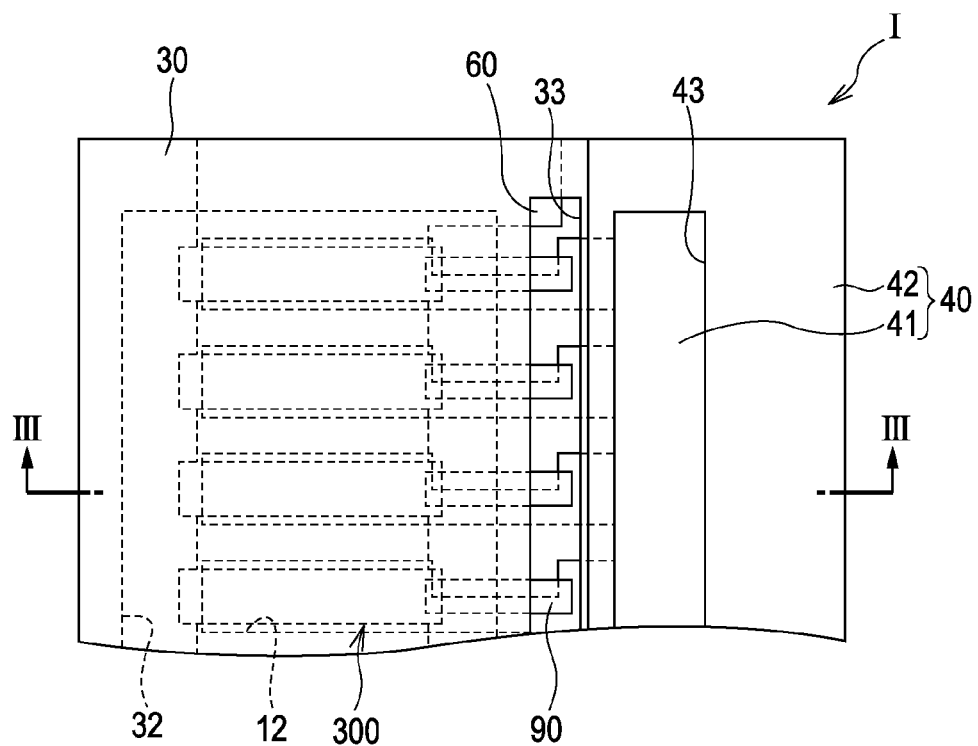
FIG. 2 is a plan view of the ink jet recording head according to the first embodiment.
Figure 3:
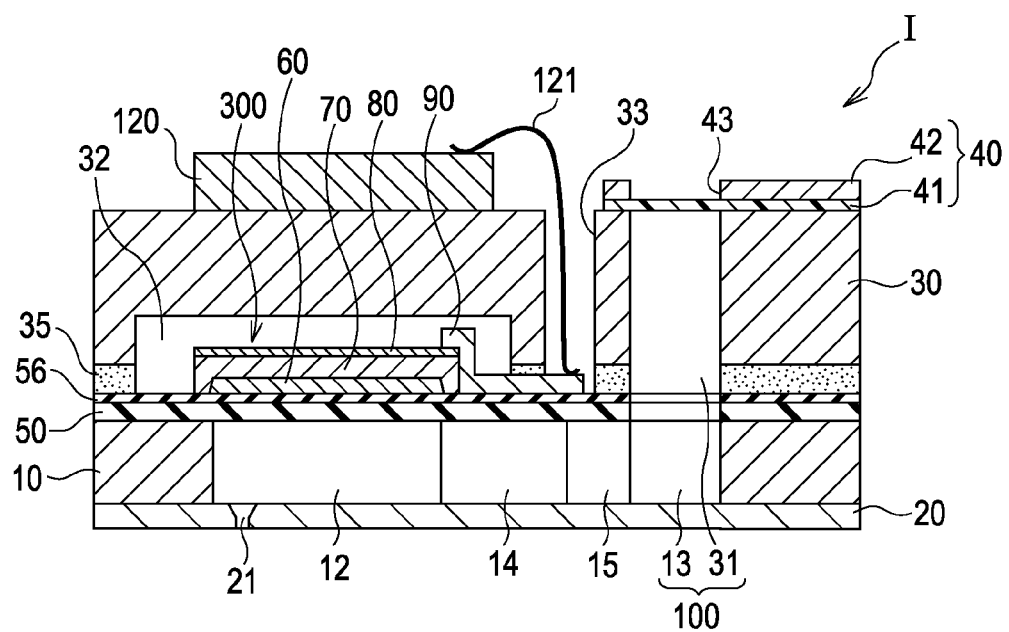
FIG. 3 is a sectional view of the ink jet recording head taken along the line III-III of FIG. 2.

FIG. 1 is an exploded perspective view of an ink jet recording head I that is an example of a liquid-ejecting head according to a first embodiment of the invention. FIG. 2 is a plan view of the ink jet recording head I. FIG. 3 is a sectional view of the ink jet recording head I taken along the line III-III of FIG. 2. With reference to FIGS. 1 to 3, the ink jet recording head I includes a channeled substrate 10 made of single-crystalline silicon and an elastic film 50 which is made of silicon dioxide and which is disposed on a surface of the channeled substrate 10.

The channeled substrate 10 includes a plurality of pressure-generating chambers 12 arranged in the width direction thereof. The channeled substrate 10 includes a communicating portion 13 disposed in a region of the channeled substrate 10 that is outwardly spaced from the pressure-generating chambers 12 in the longitudinal direction thereof. The communicating portion 13 is communicatively connected to the pressure-generating chambers 12 through ink supply channels 14 and communicating channels 15 each connected to a corresponding one of the pressure-generating chambers 12. The communicating portion 13 communicates with a manifold portion 31 below and is a portion of a manifold 100 serving as an ink chamber common to the pressure-generating chambers 12. The ink supply channels 14 are smaller in width than the pressure-generating chambers 12 and maintain the flow resistance of ink flowing from the communicating portion 13 into the pressure-generating chambers 12 constant. In this embodiment, the ink supply channels 14 are unilaterally narrow in the width direction thereof. The ink supply channels 14 may be bilaterally narrow in the width direction thereof or may be narrow in the depth direction thereof. In this embodiment, the channeled substrate 10 has a liquid passage including the pressure-generating chambers 12, the communicating portion 13, the ink supply channels 14, and the communicating channels 15.

A nozzle plate 20 is fixed on an open end surface of the channeled substrate 10 with an adhesive or a thermo-weldable film. The nozzle plate 20 has nozzle openings 21 communicating with end portions of the pressure-generating chambers 12 that are located opposite the ink supply channels 14. The nozzle plate 20 is made of, for example, glass-ceramic, single-crystalline silicon, stainless steel, or the like.

The elastic film 50 is located opposite the open end surface of the channeled substrate 10. The elastic film 50 is overlaid with an adhesive layer 56, made of titanium oxide or the like, for increasing the adhesion between the elastic film 50 and a base of a first electrode 60. An insulating layer made of zirconium oxide or the like may be disposed between the elastic film 50 and the adhesive layer 56 as required.

The adhesive layer 56 is overlaid with piezoelectric elements 300. The first electrode 60, a piezoelectric layer 70, and second electrodes 80 are arranged on the adhesive layer 56 in that order to form the piezoelectric elements 300. The piezoelectric layer 70 is a thin film and preferably has a thickness of 2 μm or less and more preferably 0.3 μm to 1.5 μm. The piezoelectric elements 300 herein refer to regions each containing a portion of the first electrode 60, a portion of the piezoelectric layer 70, and a corresponding one of the second electrodes 80. In usual, the piezoelectric elements 300 include a common electrode and other electrodes and the piezoelectric layer 70 is patterned so as to correspond to the pressure-generating chambers 12. In this embodiment, the first electrode 60 is used as a common electrode for the piezoelectric elements 300 and the second electrodes 80 are used as individual electrodes for the piezoelectric elements 300. The first and second electrodes 60 and 80 may be reversely used depending on driving circuits or wiring. Combinations of the piezoelectric elements 300 and vibrating portions displaced by driving the piezoelectric elements 300 are herein referred to as actuators. In this embodiment, the elastic film 50, the adhesive layer 56, the first electrode 60, and the insulating layer used as required act as diagrams. The invention is not limited to such a configuration. For example, the elastic film 50 or the adhesive layer 56 need not be formed. The piezoelectric elements 300 may serve substantially as diagrams.

In this embodiment, the piezoelectric layer 70 is made of a complex oxide which contains bismuth (Bi), iron (Fe), and chromium (Cr) and which has a perovskite structure and contains 0.125 to 0.875 mole of chromium per mole of the combination of iron and chromium. In the complex oxide, bismuth occupies the A-site of the perovskite structure and iron and chromium occupy the B-site thereof. Since the complex oxide contains iron and chromium, which are different in atomic radius from each other and occupy the B-site, at a predetermined ratio, the insulation and magnetism of the piezoelectric layer 70 can be maintained. The complex oxide has a morphotropic phase boundary (MPB) and therefore has excellent piezoelectric properties. When the molar ratio of chromium to the combination of iron and chromium in the complex oxide is about 0.5:1, the complex oxide has, for example, a large piezoelectric constant due to the MPB and therefore has particularly excellent piezoelectric properties. The piezoelectric layer 70 contains no lead and therefore is capable of reducing the impact on the environment.

Figure 4:
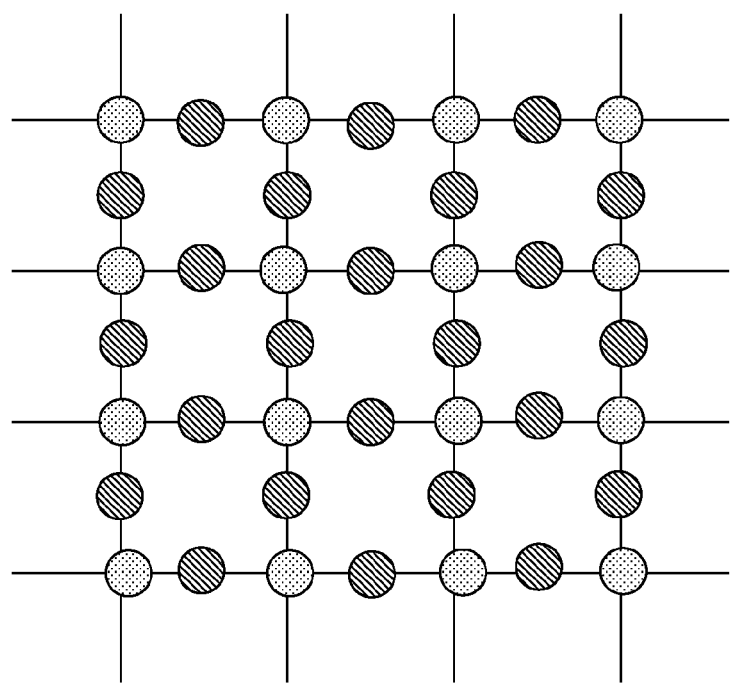
FIG. 4 is a schematic view of a crystal of a complex oxide having a perovskite structure.

FIG. 4 is a schematic view of a crystal of the complex oxide, which has the perovskite structure. Iron and chromium, which are contained in the complex oxide, have magnetism. The complex oxide, which has the perovskite structure, is maintained in an antiferromagnetic state by a magnetic network consisting of oxygen and iron or chromium, which is a B-site metal.

The piezoelectric layer 70 has a monoclinic crystal structure. That is, the piezoelectric layer 70, which is made of the complex oxide, has monoclinic symmetry. The piezoelectric layer 70 is capable of achieving high piezoelectric properties. This is because the polarization moment of the piezoelectric layer 70 is likely to rotate with respect to the electric field applied perpendicularly to a surface thereof. In the piezoelectric layer 70, the change in polarization moment thereof and the displacement of the crystal structure are directly combined with each other. This is called piezoelectricity. In a structure in which a polarization moment is likely to vary, high piezoelectricity can be achieved.

The complex oxide may further contain cerium, which occupies the A-site thereof. In other words, bismuth, which occupies the A-site of the complex oxide, may be partially replaced with cerium. Bismuth, which is contained in $BiFeO_3$ or the like, is likely to volatilize in manufacturing steps, particularly in a step of calcining the piezoelectric layer 70 and therefore has a problem that crystal defects due to the A-site are caused. Simultaneously with the elimination of bismuth, oxygen is lost such that the number of electrons is balanced. The loss of oxygen reduces the bandgap of the piezoelectric elements 300 to cause leakage currents. In order to suppress the loss of oxygen, the loss of bismuth may be suppressed. For this, a technique for using an excessive amount of Bi with respect to the stoichiometric composition is possible. However, an excessive amount of Bi occupies not only the A-site but also the B-site in a certain proportion. Bi occupying the B-site serves as an electron supplier and probably causes a problem that leakage currents are generated from the piezoelectric elements 300.

Even if the position of bismuth is lost, insulation can be maintained because the A-site contains bismuth and cerium and cerium occupies the A-site. That is, the reduction of insulation can be suppressed such that the piezoelectric layer 70 has high insulation. This allows leakage currents to be prevented from being generated from the piezoelectric elements 300. The leakage current generated from the piezoelectric layer 70 supplied with a voltage of, for example, 25 V can be preferably suppressed to $1.0 \times 10^{-1}$ A/cm$^2$ or less and more preferably $1.0 \times 10^{-3}$ A/cm$^2$ or less. The value 25 V is the typical driving voltage applied to piezoelectric elements of ink jet recording heads.

The fact that the piezoelectric layer 70 exhibits excellent insulation when the A-site of the complex oxide contains bismuth and cerium is described below with reference to FIGS. 5 to 7 using bismuth ferrate (BiFeO$_3$) as an example. In the description below, attention is focused on the A-site of the complex oxide to describe insulation.

Figure 5:
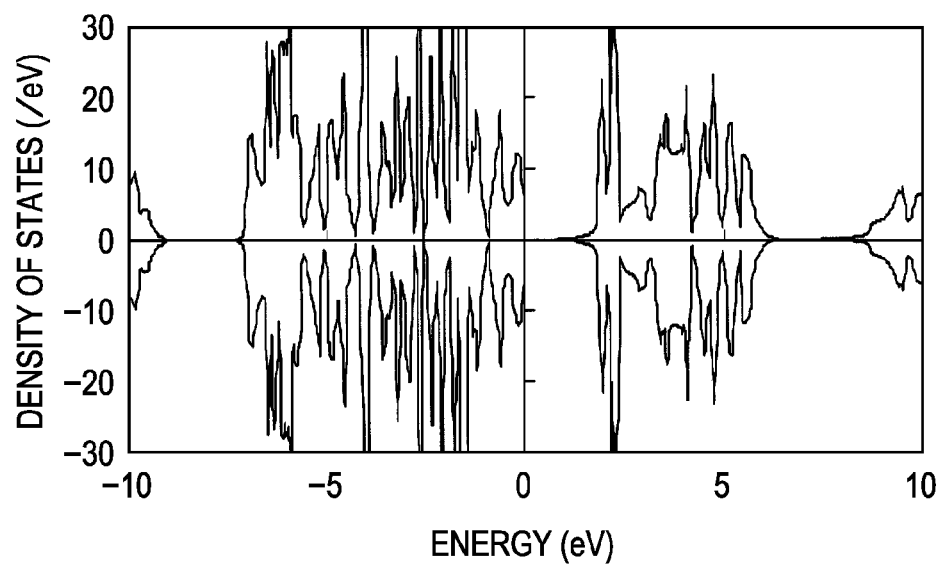
FIG. 5 is a graph showing the density of states of a $BiFeO_3$ perfect crystal.
Figure 6:
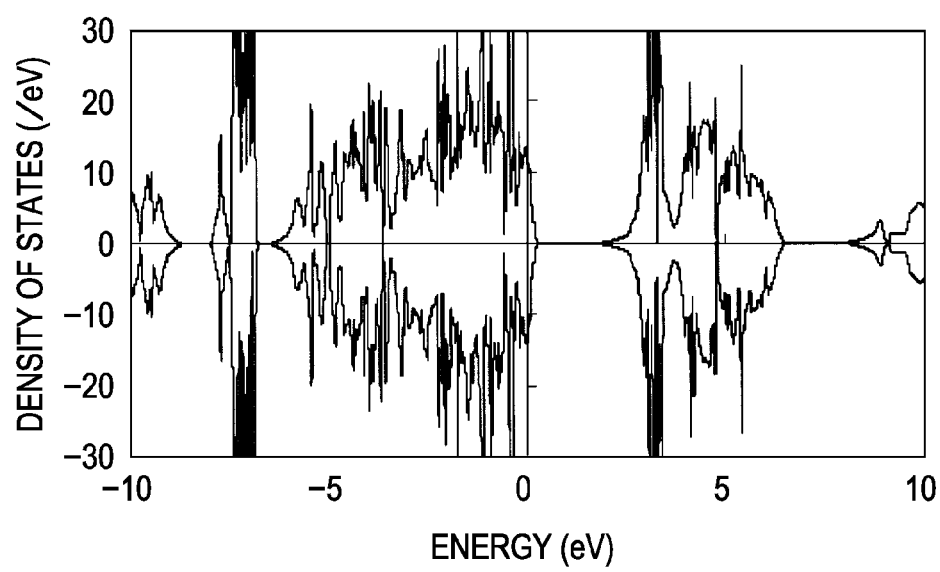
FIG. 6 is a graph showing the density of states of a $BiFeO_3$ crystal in which 12.5% of Bi is lost.
Figure 7:
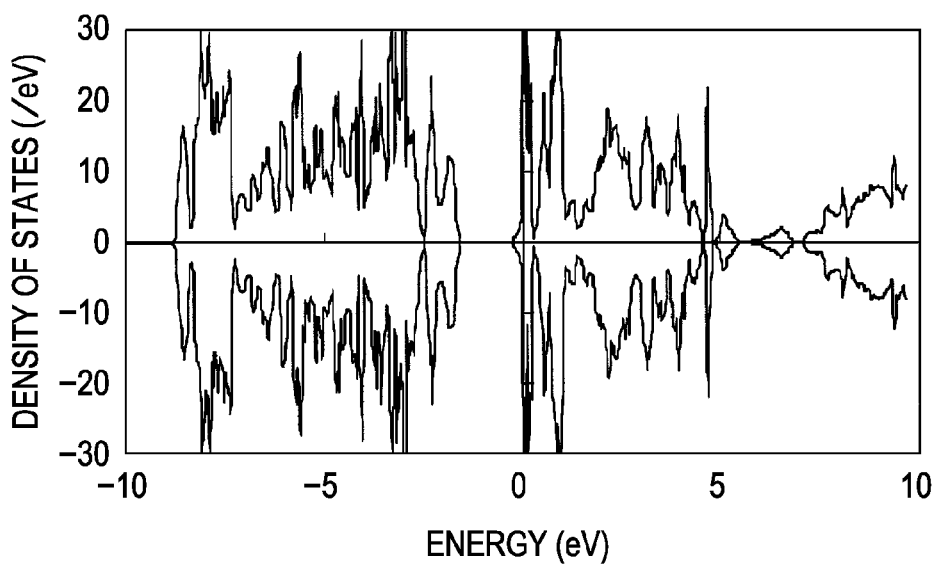
FIG. 7 is a graph showing the density of states of a $BiFeO_3$ crystal in which 12.5% of Bi is replaced with Ce.

FIGS. 5 to 7 are graphs showing the density of states (DOS) of crystals determined using first-principle electronic state calculations. The abscissa and ordinate of each graph represent the energy gap (eV) between electrons and the density of states of electrons, respectively. The positive side above a density of states of 0 eV$^{-1}$ represents an up-spin and the negative side below a density of states of 0 eV$^{-1}$ represents a down-spin. For conditions of first-principle electronic state calculations, the ultra-soft pseudopotential based on the density functional method within the generalized gradient approximation (GGA) is used. In order to take strong correlation effects due to the localization of d-electron orbitals, the GGA+U (GGA plus U) method is used for B-site transition metal atoms. The cutoff of the wave function and the cutoff of the charge density are 20 hartree and 360 hartree, respectively. Supercells used in the calculations each consist of eight (=2×2×2) ABO$_3$ perovskite structures. The mesh of reciprocal lattice points (k-points) is (4×4×4). The position of each atom is optimized such that the force acting on the atom is minimized. FIG. 5 is a graph showing the density of states of a bismuth ferrate (BiFeO$_3$) perfect crystal. FIG. 6 is a graph showing the density of states of a bismuth ferrate (BiFeO$_3$) crystal in which 12.5% of Bi is lost. FIG. 7 is a graph showing the density of states of a bismuth ferrate (BiFeO$_3$) crystal in which 12.5% of Bi is replaced with Ce.

The antiferromagnetic state of a system shown in each of FIGS. 5, 6, and 7 is stable.

As shown in FIG. 5, the BiFeO$_3$ perfect crystal, in which each site has no hole or Bi is not replaced with an other element, has a Fermi level at the top of the valence band and therefore is insulating. The term "Fermi level" refers to the highest energy level of an electron as determined from electronic state simulation.

In the BiFeO$_3$ crystal in which a small amount of bismuth (Bi) is lost and thereby defects are caused, as shown in FIG. 6, peaks appear on the positive side above an energy of 0 eV, that is, the Fermi level is positioned in the valence band. Therefore, this BiFeO$_3$ crystal is not insulating, has holes, and is of a p-type. The integral of the area of the density of states of valence band holes (the area of peaks located on the positive side) corresponds to three electrons. This shows that bismuth in this BiFeO$_3$ crystal exhibits a valence of 3+.

In the BiFeO$_3$ crystal in which a small amount of bismuth (Bi) is replaced with cerium, as shown in FIG. 7, peaks appear on the negative side below an energy of 0 eV, that is, the Fermi level is positioned in the conduction band. Therefore, this BiFeO$_3$ crystal is not insulating and is of an n-type. The integral of the area of the density of states of conduction band electrons (the area of peaks located on the negative side) corresponds to one electron. FIGS. 5 to 7 show that cerium exhibits a valence of 4+ and serves as an n-type donor.

These show that high insulation can be maintained in the case where the A-site contains bismuth and cerium, that is, a small amount of bismuth is replaced with cerium. In particular, crystal defects due to bismuth can be electrically compensated for with cerium and therefore insulation can be maintained. In the above-mentioned example, the insulation of BiFeO$_3$ is described, with attention focused on the A-site thereof. In the case where the B-site contains chromium, the behavior of the position of the Fermi level or the like is similar as described below.

The A-site can be can be represented by the formula Bi$_{1-x}$Ce$_y$, wherein x is the amount of lost bismuth and y is the amount of added cerium. As proved by the first-principle calculations, bismuth serves as a trivalent element and cerium serves as a tetravalent element. In order to maintain the electroneutrality of a crystal, the A-site may be trivalent as a whole. Therefore, the compositional balance of Bi and Ce may satisfy the equation 3(1−x)+4y=3. That is, the content of cerium may be 3x/4 with respect to the amount x of lost bismuth. Thus, for example, a complex oxide satisfying the formula (Bi$_{1-x}$, Ce$_{3x/4}$)(Cr$_{1-δ}$, Fe$_δ$)O$_3$ can be produced in such a manner that the amount of added cerium is set to 3x/4 with respect to the anticipated amount x of lost bismuth. Under such a condition, even if bismuth is lost and therefore the number of electrons is reduced, oxygen defects are hardly formed because excessive electrons owned by added cerium compensate for a reduced number of electrons. On an experimental level, the complex oxide preferably contains 0.01 to 0.13 mole of cerium per mole of the combination of bismuth and cerium. This allows the complex oxide to have higher insulation as compared to Ce-free systems such as BiFeO$_3$ complex oxides and also allows a leakage current to be suppressed.

Figure 8:
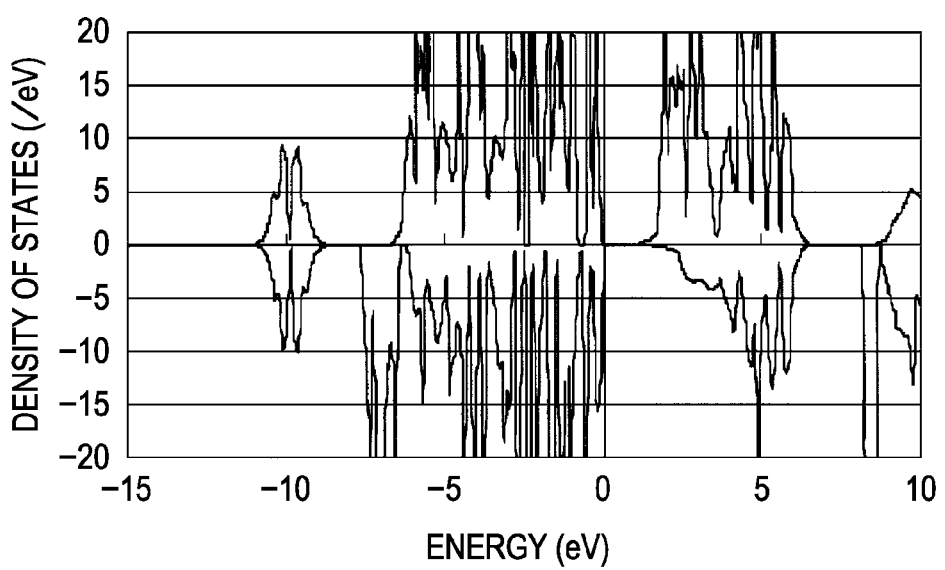
FIG. 8 is a graph showing the density of states of a $Bi(Fe_{0.5}, Cr_{0.5})O_3$ perfect crystal.

The fact that piezoelectric layer 70, which is made of the complex oxide containing bismuth (Bi), iron (Fe), and chromium (Cr), exhibit excellent insulation is described below with reference to FIG. 8. FIG. 8 is a graph showing the density of states of a bismuth ferrate chromate (Bi(Fe$_{0.5}$, Cr$_{0.5}$)O$_3$) perfect crystal in which the molar ratio of iron to chromium is 1:1. FIG. 8 is one obtained by substantially the same method as that used to obtain FIGS. 5 to 7 and describes insulation with attention focused on the B-site of the complex oxide.

As shown in FIG. 8, bismuth ferrate chromate has a Fermi level at the top of the valence band and therefore is insulating. Bi(Fe$_{0.5}$, Cr$_{0.5}$)O$_3$) is as described above with reference to FIG. 8. Even if the relative proportions of elements therein are varied, the behavior of the position of the Fermi level or the like is similar as described above.

The A-site of the complex oxide may contain lanthanum. The presence of lanthanum in the A-site allows structures other than the perovskite structure to be prevented from being caused. Since lanthanum is a metal element with a valence of +3, the presence of these metal elements in the A-site does not adversely affect leakage current conditions because the "valence balance" specified herein does not vary. The molar ratio of lanthanum to the combination of bismuth, cerium, and lanthanum in the A-site is preferably 0.05:1 to 0.20:1.

The piezoelectric layer 70 preferably has an engineered domain configuration in which the polarization of the piezoelectric layer 70 is inclined to a direction perpendicular to a surface of the piezoelectric layer 70 (the thickness direction of the piezoelectric layer 70) at a predetermined angle of 50 degrees to 60 degrees.

The second electrodes 80, which are individual electrodes for the piezoelectric elements 300, are connected to lead electrodes 90 which extend from regions near end portions of the ink supply channels 14 to the adhesive layer 56 and which are made of, for example, gold (Au) or the like.

A protective substrate 30 including the manifold portion 31, which is a portion of the manifold 100, is fixed on the channeled substrate 10 having the piezoelectric elements 300, that is, on the first electrode 60, the adhesive layer 56, and the lead electrodes 90, with an adhesive 35. In this embodiment, the manifold portion 31 extends through the protective substrate 30 in the thickness direction thereof and also extends in the width direction of the pressure-generating chambers 12. The manifold portion 31 communicates with the communicating portion 13 of the channeled substrate 10. The manifold portion 31 and the communicating portion 13 form the manifold 100, which serves as an ink chamber common to the pressure-generating chambers 12, as described above. The communicating portion 13 of the channeled substrate 10 may be divided into a plurality of sub-portions corresponding to the pressure-generating chambers 12 such that the manifold portion 31 alone serves as a manifold. The ink supply channels 14 may be arranged in a member (for example, the elastic film 50, the adhesive layer 56, or the like) disposed between the channeled substrate 10 and the protective substrate 30 so as to communicatively connect the manifold 100 to the pressure-generating chambers 12 in such a state that, for example, only the pressure-generating chambers 12 are arranged in the channeled substrate 10.

The protective substrate 30 has a region facing the piezoelectric elements 300 and includes a piezoelectric element-holding portion 32 which is disposed in this region and which has such a space that does not prevent the motion of the piezoelectric elements 300. In the piezoelectric element-holding portion 32, the space may be sealed or unsealed as long as the space does not prevent the motion of the piezoelectric elements 300.

The protective substrate 30 is preferably made of a material, such as a glass or ceramic material, having substantially the same thermal expansion coefficient as that of the channeled substrate 10. In this embodiment, the protective substrate 30 is made of single-crystalline silicon, which is the same material as that used to form the channeled substrate 10.

The protective substrate 30 has a through-hole 33 extending therethrough in the thickness direction of the protective substrate 30. The lead electrodes 90 each extend from a corresponding one of the piezoelectric elements 300 and have end portions exposed in the through-hole 33.

The protective substrate 30 is overlaid with a driving circuit 120, fixed thereon, for driving the piezoelectric elements 300. Examples of the driving circuit 120 include circuit boards and semiconductor integrated circuits (ICs). The driving circuit 120 is electrically connected to the lead electrodes 90 through connecting lines 121 including conductive wires such as bonding wires.

The protective substrate 30 is also overlaid with a compliance substrate 40, fixed thereon, including a sealing film 41 and a fixed plate 42. The sealing film 41 is made of a flexible material having low stiffness. A surface of the manifold portion 31 is sealed with the sealing film 41. The fixed plate 42 is made of a relatively hard material. The fixed plate 42 has an opening 43 formed by entirely removing a region of the fixed plate 42 that faces the manifold 100 in the thickness direction of the fixed plate 42 and therefore a surface of the manifold 100 is sealed with the sealing film 41, which is flexible.

After the ink jet recording head I is supplied with ink from an ink supply port connected to an external ink supply unit, which is not shown, and an inner region extending from the manifold 100 to the nozzle openings 21 is filled with the ink, voltages are applied between the first electrode 60 and the second electrodes 80 corresponding to the pressure-generating chambers 12 in accordance with recording signals transmitted from the driving circuit 120, whereby the elastic film 50, the adhesive layer 56, the first electrode 60, and the piezoelectric layer 70 are deformed. This increases the pressure in the pressure-generating chambers 12, thereby ejecting droplets of the ink from the nozzle openings 21.

An exemplary method for manufacturing the ink jet recording head I will now be described with reference to FIGS. 9A to 13B.

Figure 9A:
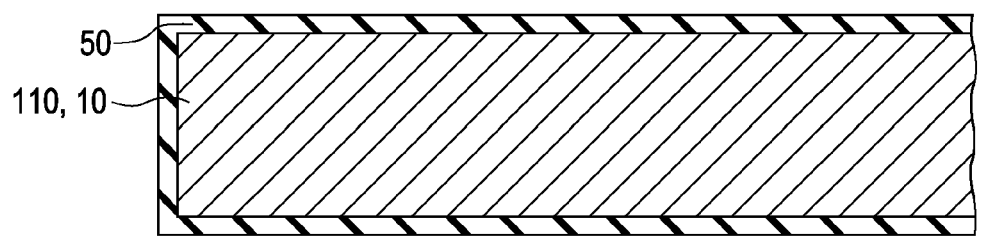
FIGS. 9A and 9B are sectional views showing steps of manufacturing the ink jet recording head according to the first embodiment.
Figure 9B:
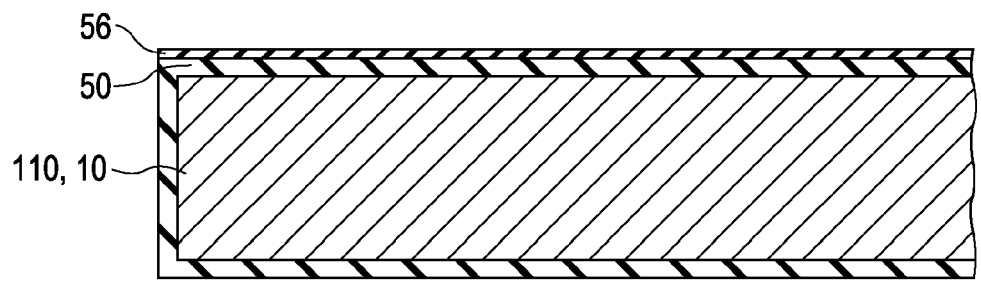

As shown in FIG. 9A, a silicon dioxide film, made of silicon dioxide ($SiO_2$), forming the elastic film 50 is formed on a channeled-substrate wafer 110 made of silicon by thermal oxidation or the like. As shown in FIG. 9B, the adhesive layer 56 is formed on the elastic film 50 (the silicon dioxide film) by reactive sputtering, thermal oxidation, or the like using titanium oxide or the like.

Figure 10A:
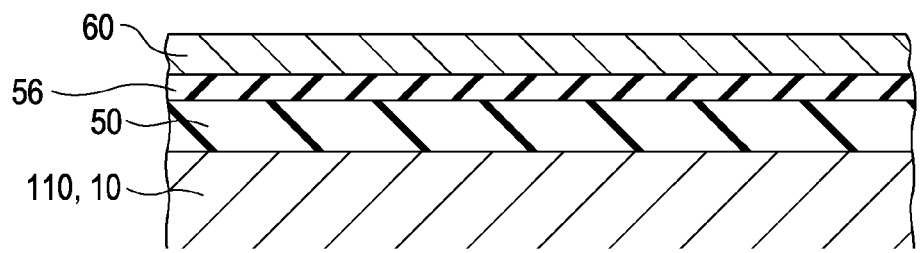
FIGS. 10A to 10C are sectional views showing steps of manufacturing the ink jet recording head according to the first embodiment.

As shown in FIG. 10A, the first electrode 60 is formed on the adhesive layer 56. In particular, platinum, iridium, iridium oxide, or a multilayer structure of these materials is deposited on the adhesive layer 56, whereby the first electrode 60 is formed on the adhesive layer 56. The adhesive layer 56 and the first electrode 60 can be formed by, for example, a sputtering process or a vapor deposition process.

The piezoelectric layer 70 is deposited on the first electrode 60. A process for preparing the piezoelectric layer 70 is not particularly limited. The piezoelectric layer 70, which is made of the complex oxide, can be formed by, for example, a chemical solution process such as a metal-organic deposition (MOD) process or a sol-gel process in such a manner that a solution prepared by dissolving or dispersing an organometallic compound in a solvent is applied to the first electrode 60, is dried, and is then fired at a high temperature. The piezoelectric layer 70 may be formed by a laser ablation process, a pulsed laser deposition (PLD) process, a chemical vapor deposition (CVD) process, an aerosol deposition process, or a similar process.

Figure 10B:
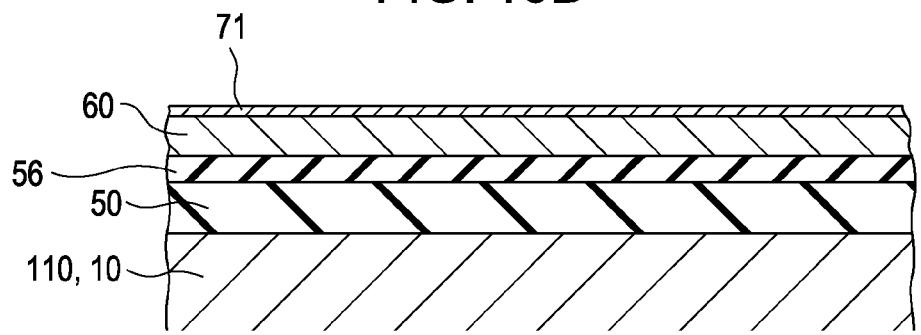

In particular, a procedure for forming the piezoelectric layer 70 is as described below. As shown in FIG. 10B, a piezoelectric precursor film 71 is formed in such a manner that a sol or MOD solution (precursor solution) containing organometallic compounds, particularly organometallic compounds containing Bi, Fe, and Cr and further containing Ce and La as required in proportions giving a desired composition is applied to the first electrode 60 by a spin coating process or the like (a coating step).

The precursor solution applied thereto is prepared in such a manner that organometallic compounds capable of forming a complex oxide which contain Bi, Fe, and Cr and which further contain Ce and La as required are mixed together so as to give a desired molar ratio and the mixture is dissolved or dispersed in an organic solvent such as alcohol. The amount of added cerium is adjusted to 3x/4 with respect to the anticipated amount x of lost Bi.

The term "organometallic compounds capable of forming a complex oxide which contain Bi, Fe, and Cr and which further contain Ce and La as required by firing" as used herein refers to an organometallic compound mixture containing one or more selected from the group consisting of Bi, Fe, Cr, Ce, and La. Examples of organometallic compounds each containing a corresponding one of Bi, Fe, Cr, Ce, and La include metal alkoxides, organic salts, and β-diketone complexes. An example of an organometallic compound containing Bi is bismuth 2-ethylhexanoate. An example of an organometallic compound containing Fe is iron 2-ethylhexanoate. An example of an organometallic compound containing Cr is chromium 2-ethylhexanoate. An example of an organometallic compound containing Ce is cerium 2-ethylhexanoate. An example of an organometallic compound containing La is lanthanum 2-ethylhexanoate. An organometallic compound containing two or more selected from the group consisting of Bi, Fe, Cr, Ce, and La may be used herein.

The piezoelectric precursor film 71 is heated at a predetermined temperature for a predetermined time, whereby the piezoelectric precursor film 71 is dried (a drying step). The dried piezoelectric precursor film 71 is heated to a predetermined temperature and is then held at this temperature for a predetermined time, whereby the piezoelectric precursor film 71 is degreased (a degreasing step). The term "degreasing" as used herein means that an organic component contained in the piezoelectric precursor film 71 is removed in the form of $NO_2$, $CO_2$, $H_2O$, or the like. An atmosphere used in the drying or degreasing step is not particularly limited and may be an air or inert gas atmosphere.

Figure 10C:
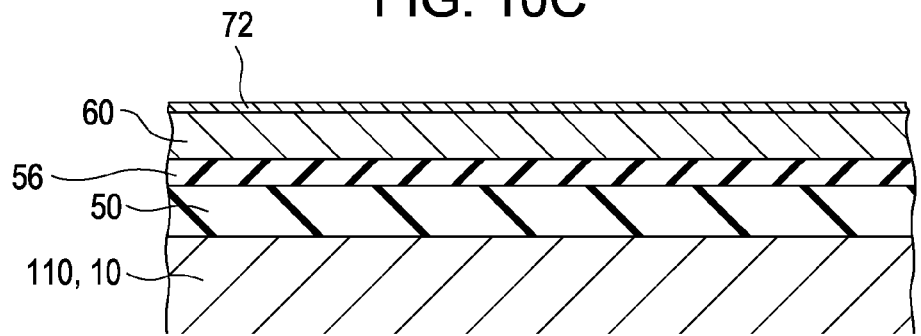

As shown in FIG. 10C, the piezoelectric precursor film 71 is crystallized in such a manner that the piezoelectric precursor film 71 is heated at a predetermined temperature of, for example, about 600° C. to 800° C. and is then held at this temperature for a predetermined time, whereby a piezoelectric film 72 is formed (a calcining step). An atmosphere used in the calcining step is not particularly limited and may be an air or inert gas atmosphere.

Examples of a heating unit used in the drying step, the degreasing step, and the calcining step include hotplates and rapid thermal annealing (RTA) systems including infrared lamps for heating.

Figure 11A:
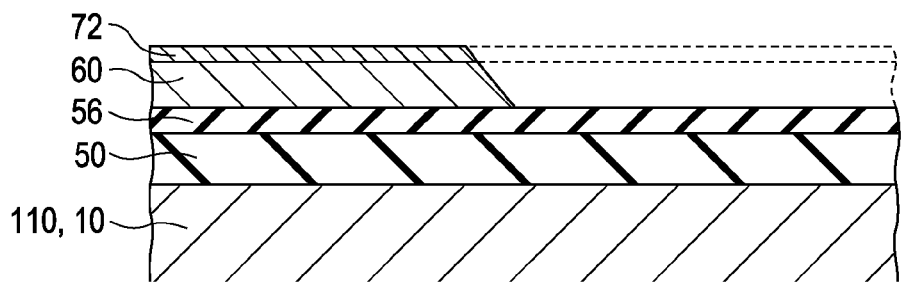
FIGS. 11A and 11B are sectional views showing steps of manufacturing the ink jet recording head according to the first embodiment.

As shown in FIG. 11A, a resist (not shown) having a predetermined pattern is provided on the piezoelectric film 72 and the first electrode 60 and the piezoelectric film 72 are patterned together using the resist as a mask such that side surfaces of each of the first electrode 60 and the piezoelectric film 72 are inclined.

Figure 11B:
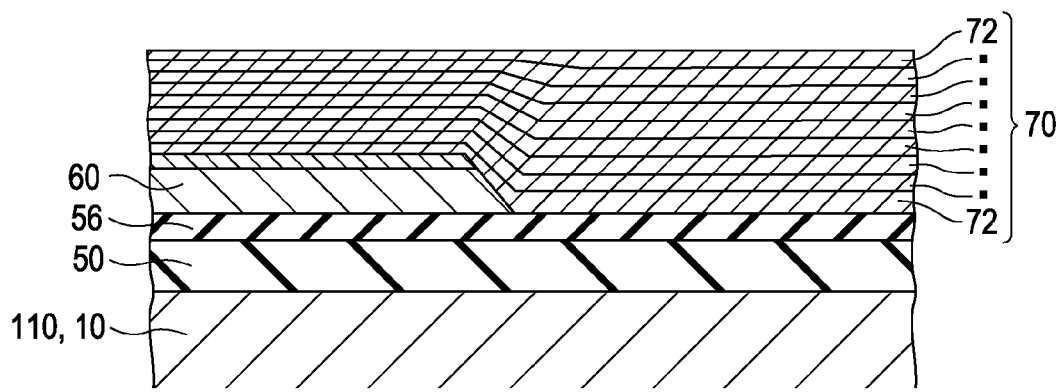

After the resist is stripped off, the coating step, the drying step, the degreasing step, and/or the calcining step is repeated several times depending on the desired thickness of the piezoelectric layer 70, whereby the piezoelectric layer 70 is formed so as to include a plurality of piezoelectric films 72 and so as to have a predetermined thickness as shown in FIG. 11B. When the thickness of a film obtained by one shot of the precursor solution is about 0.1 µm and the number of the piezoelectric films 72 is ten, the piezoelectric layer 70 has a thickness of about 1.1 µm. In this embodiment, the piezoelectric layer 70 includes the stacked piezoelectric films 72. The piezoelectric layer 70 may include the single piezoelectric film 72.

Figure 12A:
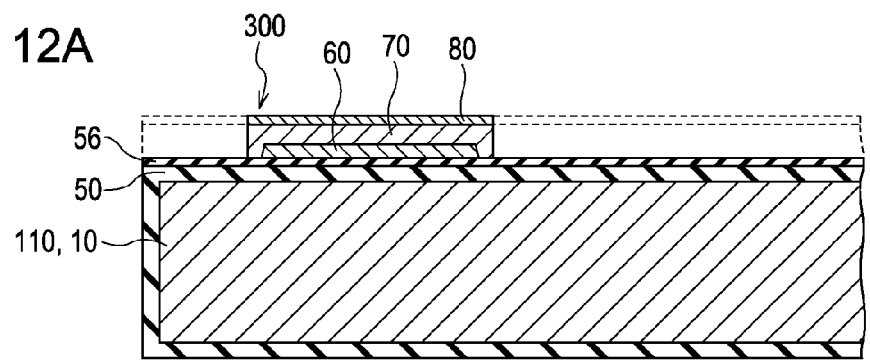
FIGS. 12A to 12C are sectional views showing steps of manufacturing the ink jet recording head according to the first embodiment.

After the piezoelectric layer 70 is formed as described above, the second electrodes 80 are formed on the piezoelectric layer 70 by a sputtering process or the like using platinum or the like. The piezoelectric layer 70 and the second electrodes 80 are patterned together, whereby the piezoelectric elements 300, which include portions of the first electrode 60, portions of the piezoelectric layer 70, and the second electrodes 80, are formed in a region facing the pressure-generating chambers 12 as shown in FIG. 12A. The piezoelectric layer 70 and the second electrodes 80 can be patterned together by dry etching using a resist (not shown) having a predetermined pattern. The piezoelectric elements 300 may be post-annealed at a temperature of 600° C. to 800° C. as required. This allows the interface between the piezoelectric layer 70 and the first electrode 60 and the interfaces between the piezoelectric layer 70 and the second electrodes 80 to be good and also allows the crystallinity of the piezoelectric layer 70 to be improved.

Figure 12B:
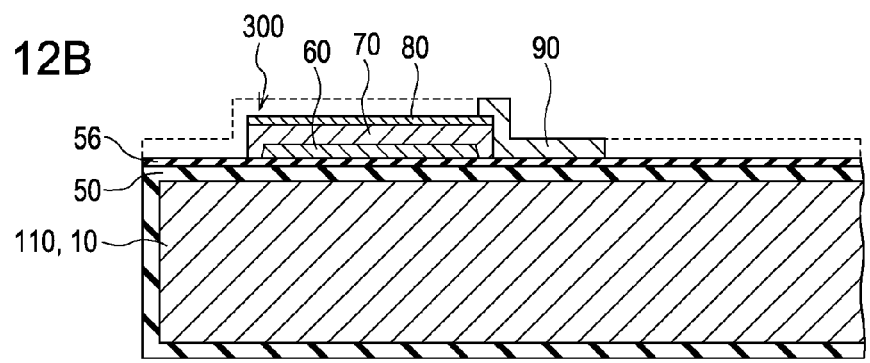

As shown in FIG. 12B, the lead electrodes 90 are formed over the channeled-substrate wafer 110 using, for example, gold (Au) or the like and are then patterned through a mask pattern (not shown) made of, for example, a resist so as to correspond to the piezoelectric elements 300.

Figure 12C:
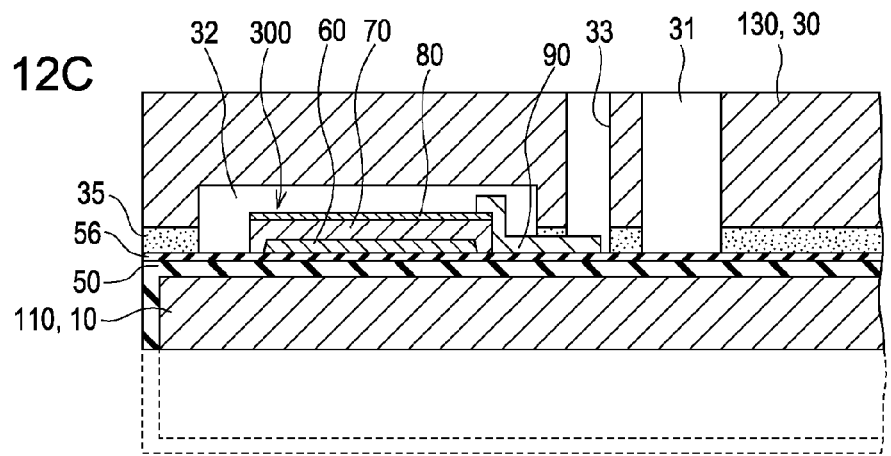

After a protective substrate wafer 130, made of silicon, for forming the protective substrate 30 and other protective substrates is bonded to a surface of the channeled-substrate wafer 110 that is overlaid with the piezoelectric elements 300 with the adhesive 35, the channeled-substrate wafer 110 is thinned so as to have a predetermined thickness as shown in FIG. 12C.

Figure 13A:
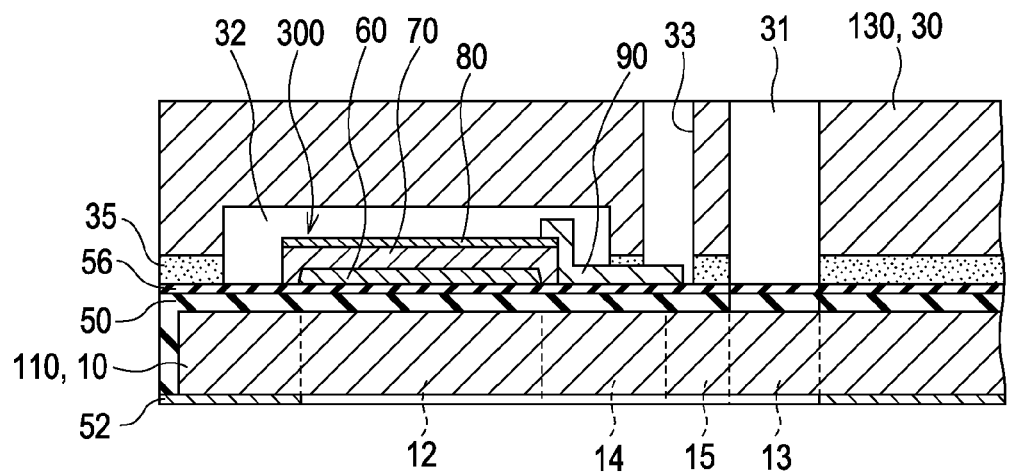
FIGS. 13A and 13B are sectional views showing steps of manufacturing the ink jet recording head according to the first embodiment.

As shown in FIG. 13A, a mask film 52 is formed on the channeled-substrate wafer 110 and is then patterned so as to have a predetermined pattern.

Figure 13B:
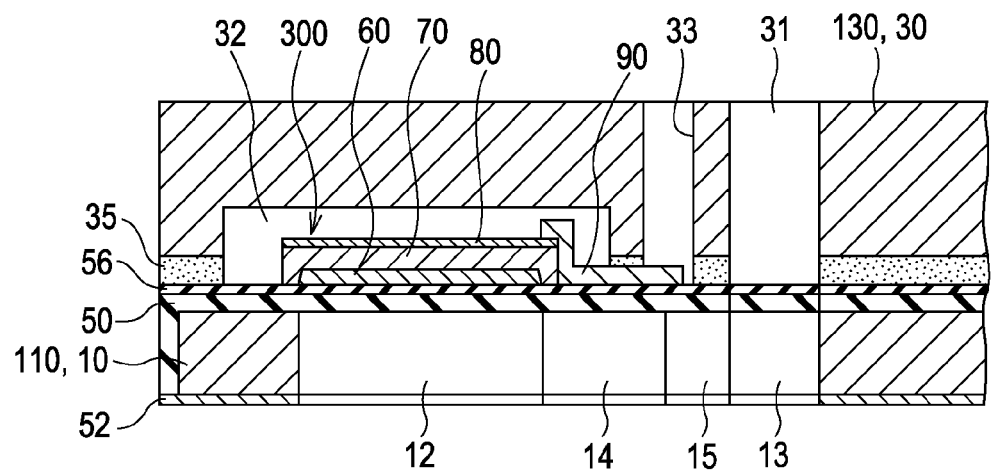

As shown in FIG. 13B, the communicating portion 13, the ink supply channels 14, the communicating channels 15, and the pressure-generating chambers 12, which correspond to the piezoelectric elements 300, are formed in such a manner that the channeled-substrate wafer 110 is anisotropically etched (wet-etched) through the mask film 52 using an alkali solution containing KOH or the like.

Unnecessary peripheral portions are cut off from the channeled-substrate wafer 110 and the protective substrate wafer 130 by, for example, dicing or the like. After the mask film 52 is removed, the nozzle plate 20 having the nozzle openings 21 is bonded to a surface of the channeled-substrate wafer 110 that is located opposite the protective substrate wafer 130 and the compliance substrate 40 is bonded to the protective substrate wafer 130. The channeled-substrate wafer 110 and the other members are divided into the channeled substrate 10 and chip-sized pieces as shown in FIG. 1, whereby the ink jet recording head I is obtained.

Other Embodiments

The first embodiment is as described above. A basic configuration according to the invention is not limited to that described above. In the first embodiment, the channeled substrate 10 is made of single-crystalline silicon as exemplified above. The channeled substrate 10 is not limited to such a material. For example, an SOI substrate or a substrate made of glass or the like may be used instead of the channeled substrate 10.

In the first embodiment, the piezoelectric elements 300 include the first electrode 60, the piezoelectric layer 70, and the second electrodes 80, which are deposited on a substrate (the channeled substrate 10) in that order, as exemplified above. The invention is not limited to the piezoelectric elements 300 and is applicable to longitudinally vibrating piezoelectric elements which include piezoelectric material layers and electrode-forming material layers arranged alternately and which expands and contracts in the axial direction thereof.

Figure 14:
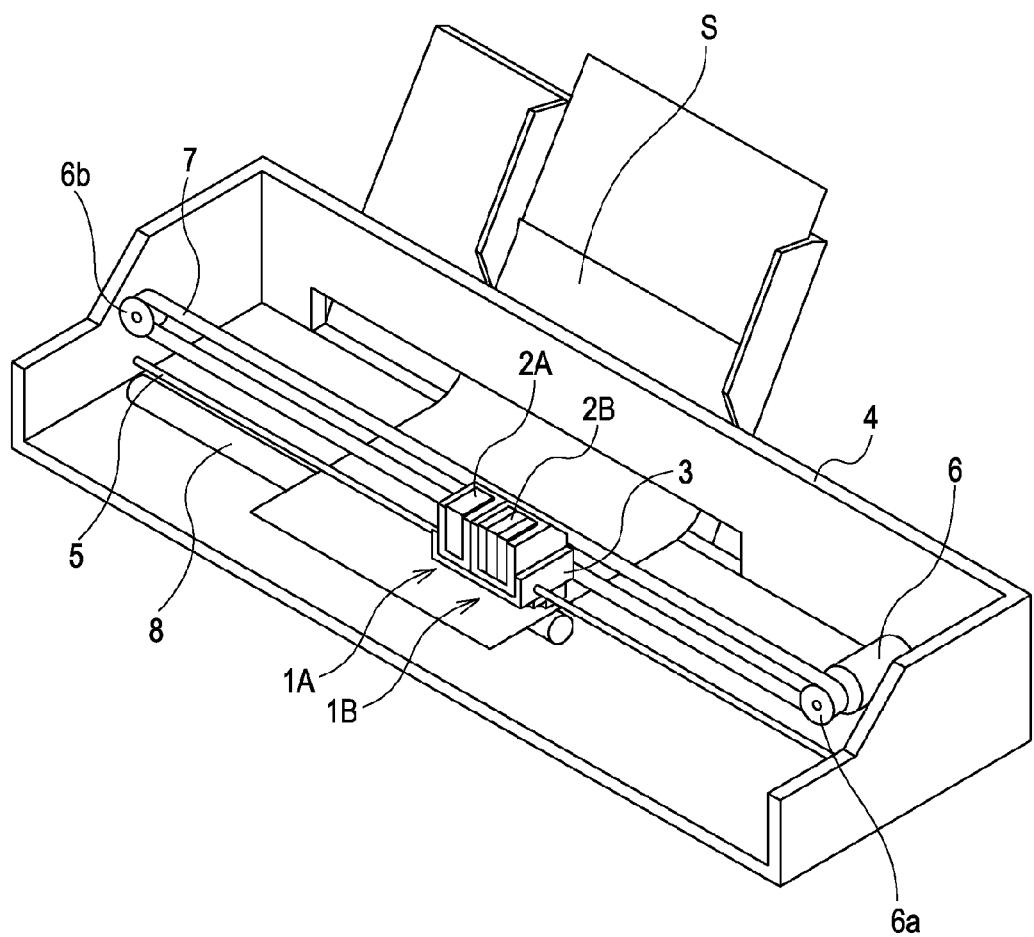
FIG. 14 is a schematic view of an ink jet recording apparatus according to an embodiment of the invention.

An ink jet recording head according to an embodiment of the invention is mountable in an ink jet recording apparatus so as to form a portion of a recording head unit having an ink channel communicating with an ink cartridge and the like. FIG. 14 is a schematic view of such an ink jet recording apparatus.

With reference to FIG. 14, cartridges 2A and 2B forming an ink supply unit are detachably attached to recording head units 1A and 1B, respectively, each including an ink jet recording head I. The recording head units 1A and 1B are mounted on a carriage 3. The carriage 3 is attached to a carriage shaft 5 attached to an apparatus body 4 so as to be movable in the axial direction of the carriage shaft 5. The recording head units 1A and 1B eject a black ink composition and a color ink composition, respectively.

The carriage 3, which carries the recording head units 1A and 1B, is moved along the carriage shaft 5 in such a manner that the driving force generated by a driving motor 6 is transmitted to the carriage 3 through a plurality of gears, which are not shown, and a timing belt 7. The apparatus body 4 includes a platen 8 extending along the carriage shaft 5. A recording sheet S which is a recording medium made of paper or the like is transported in such a manner that the recording sheet S is fed by feed rollers, which are not shown, and is wrapped on the platen 8.

In the ink jet recording apparatus shown in FIG. 14, the recording head units 1A and 1B each include one of the ink jet recording heads I. The ink jet recording apparatus is not limited to such a configuration. The recording head units 1A and 1B may each include two or more ink jet recording heads.

In the first embodiment, the ink-jet recording head has been described as an example of the liquid-ejecting head. The invention is directed to various liquid-ejecting heads and is applicable to liquid-ejecting heads ejecting liquids other than ink. Other examples of the liquid-ejecting head include various recording heads for use in image-recording apparatuses such as printers, colorant-ejecting heads used to manufacture color filters for liquid crystal displays, electrode material-ejecting heads used to form electrodes for field emission displays (FEDs), and bio-organic substance-ejecting heads used to produce biochips.

A piezoelectric element according to the inventor exhibits good insulation and piezoelectric properties and therefore can be used for, but is not limited to, liquid-ejecting heads represented by ink-jet recording heads. The invention is applicable to piezoelectric elements such as ultrasonic devices including ultrasonic oscillators; ultrasonic motors; piezoelectric transducers; and various sensors including infrared sensors, ultrasonic sensors, heat sensors, pressure sensors, and pyroelectric sensors. Furthermore, the invention is applicable to ferroelectric elements such as ferroelectric memories.

What is claimed is:

1. A piezoelectric element comprising:
   electrodes; and
   a piezoelectric layer provided between the electrodes,
   wherein the piezoelectric layer is made of a complex oxide which contains bismuth, iron, chromium, and cerium; and
   wherein the complex oxide is represented by the following formula:

$$(Bi_{1-x},Ce_{3x/4})(Cr_{1-\delta},Fe_{\delta})O_3 \quad (1).$$

2. The piezoelectric element according to claim 1, wherein bismuth is contained in the A-site of the complex oxide and iron and chromium are contained in the B-site thereof.

3. The piezoelectric element according to claim 1, wherein the piezoelectric layer has a monoclinic crystal structure.

4. The piezoelectric element according to claim 1, wherein the complex oxide further contains lanthanum.

5. A liquid-ejecting head comprising the piezoelectric element according to claim 1.

6. A liquid-ejecting apparatus comprising the liquid-ejecting head according to claim 5.

7. The piezoelectric element according to claim 1, wherein $\delta=0.125$ to $0.875$.

* * * * *